(12) United States Patent
Tsubaki et al.

(10) Patent No.: US 11,501,991 B2
(45) Date of Patent: Nov. 15, 2022

(54) CONTAINER STORAGE AND CONTAINER STORAGE METHOD

(71) Applicant: MURATA MACHINERY, LTD., Kyoto (JP)

(72) Inventors: Tatsuo Tsubaki, Ise (JP); Takashi Yamaji, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 256 days.

(21) Appl. No.: 16/307,959

(22) PCT Filed: May 8, 2017

(86) PCT No.: PCT/JP2017/017377
§ 371 (c)(1),
(2) Date: Dec. 7, 2018

(87) PCT Pub. No.: WO2017/212841
PCT Pub. Date: Dec. 14, 2017

(65) Prior Publication Data
US 2019/0304822 A1 Oct. 3, 2019

(30) Foreign Application Priority Data
Jun. 8, 2016 (JP) .............................. JP2016-114321

(51) Int. Cl.
*H01L 21/673* (2006.01)
*H01L 21/677* (2006.01)
(52) U.S. Cl.
CPC ...... *H01L 21/67389* (2013.01); *H01L 21/673* (2013.01); *H01L 21/677* (2013.01); *H01L 21/67733* (2013.01)

(58) Field of Classification Search
CPC ............. H01L 21/67389; H01L 21/673; H01L 21/677; H01L 21/67733
USPC ......................................................... 454/184
See application file for complete search history.

(56) References Cited

U.S. PATENT DOCUMENTS

| 8,151,816 | B2 * | 4/2012 | Favre ................. H01L 21/67017 137/15.04 |
| 9,406,537 | B2 * | 8/2016 | Oyama .............. H01L 21/67373 |
| 2008/0260498 | A1 * | 10/2008 | Nagata .............. H01L 21/67017 414/217 |
| 2014/0157722 | A1 * | 6/2014 | Iwamoto ........... H01L 21/67772 53/111 R |
| 2015/0024671 | A1 * | 1/2015 | Taniyama ......... H01L 21/67017 454/193 |

(Continued)

FOREIGN PATENT DOCUMENTS

| JP | 2005-327815 A | 11/2005 |
| JP | 2016-066689 A | 4/2016 |
| WO | 2015/166710 A1 | 11/2015 |

OTHER PUBLICATIONS

Official Communication issued in International Patent Application No. PCT/JP2017/017377, dated Jul. 25, 2017.

(Continued)

*Primary Examiner* — Allen R. B. Schult
(74) *Attorney, Agent, or Firm* — Keating & Bennett, LLP

(57) ABSTRACT

A container storage includes a purger that supplies a purge gas into a stored container and an evacuator that is disposed near a lid of the container and evacuates an atmosphere around the lid.

8 Claims, 13 Drawing Sheets

(56) References Cited

U.S. PATENT DOCUMENTS

2015/0235884 A1    8/2015   Jang et al.
2016/0358799 A1   12/2016   Murata et al.

OTHER PUBLICATIONS

Official Communication issued in International Patent Application No. PCT/JP2017/017377, dated Jun. 5, 2018.
Official Communication issued in corresponding Chinese Patent Application No. 201780034836.5, dated Sep. 5, 2022.

* cited by examiner

CONTAINER STORAGE AND CONTAINER STORAGE METHOD

BACKGROUND OF THE INVENTION

1. Field of the Invention

The present invention relates to a container storage and a container storage method.

2. Description of the Related Art

In a semiconductor manufacturing plant or the like, a container (e.g., front opening unified pod (FOUP)) containing semiconductor wafers is transported by, for example, a ceiling transport vehicle. A container storage for temporarily storing a container may be installed on the route along which a container is transported to a processor. Such a container storage includes a purger that introduces a purge gas, such as a nitrogen gas, into a container (for example, see Japanese Unexamined Patent Application Publication No. 2015-533026. A container storage disclosed in Japanese Unexamined Patent Application Publication No. 2015-53302 introduces a purge gas into a container through a supply port of the bottom of the container, and the gas in the container is discharged through a discharge port of the bottom of the container.

A side surface of the container is provided with a lid to block an opening through which an article is loaded and unloaded. The gas leaks from the sealed portion or the like of the lid in a larger amount than the amount of gas discharged from the discharge port, and the leak gas is dispersed around the lid. Since container storages as described above are provided as temporary storages, many of them are open structures consisting of a frame alone. The gas leaking from the sealed portion of the lid is released outside the container storage. Depending on the type or concentration of the gas, the surrounding environment may degrade.

SUMMARY OF THE INVENTION

Preferred embodiments of the present invention provide container storages and container storage methods that are able to reduce or prevent degradation of the surrounding environment caused by a gas leaking from the lid of a container.

A container storage according to a preferred embodiment of the present invention includes a purger that supplies a purge gas into a stored container and an evacuator that is disposed near a lid of the container and evacuates an atmosphere around the lid.

The container storage may be disposed near a ceiling and may be able to receive the container from a ceiling transport vehicle that transports the container. The evacuator may include a hood disposed so as to face the lid. The hood may be disposed so as to surround a side surface of the container. The container storage may include a discharge channel through which a gas evacuated through the hood is discharged. The evacuator may include a fan for diffusion.

A container storage method according to a preferred embodiment of the present invention includes supplying a purge gas into a stored container and evacuating an atmosphere around a lid of the container.

The container storage method may include evacuating the atmosphere around the lid of the container while supplying the purge gas into the container.

A container storage according to a preferred embodiment of the present invention includes the evacuator that is disposed near the lid of the container and evacuates the atmosphere around the lid, and thus is able to evacuate a gas leaking from the lid of the container using the evacuator and thus to reduce or prevent environmental degradation around the lid of the container.

If the container storage is disposed near the ceiling and is able to receive the container from the ceiling transport vehicle that transports the container, the gas leaking from the lid of the container is evacuated using the evacuator even if the container storage is an open structure. Thus, the container storage is able to reduce or prevent environmental degradation around the container storage. Also, if the evacuator includes the hood disposed so as to face the lid, the container storage is able to efficiently evacuate the gas leaking from the lid of the container using the hood. Also, if the hood is disposed so as to surround the side surface of the container, the container storage is able to easily evacuate the gas leaking from the container, including the gas near the lid of the container. Also, if the container storage includes the discharge channel through which the gas evacuated through the hood is discharged, the gas is able to be reliably removed from the vicinity of the container by feeding the evacuated gas to the discharge channel. Also, if the container storage includes the fan for diffusion, the gas leaking from the lid is able to be diffused using the fan and thus to reduce or prevent the presence of the gas near the lid.

A container storage method according to a preferred embodiment of the present invention includes supplying the purge gas into the stored container and evacuating the atmosphere around the lid of the container. Thus, even if the gas leaks from the lid of the container, the gas is evacuated, enabling reduction or prevention of environmental degradation around the lid of the container.

If a container storage method includes evacuating the atmosphere around the lid of the container while supplying the purge gas into the container, the atmosphere around the lid of the container is evacuated at the timing when the purge gas is supplied. This allows for reduction or prevention of useless evacuation and thus a reduction in the operation cost.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A to 4C are drawings showing an example of a container storage of a second preferred embodiment of the present invention, in which FIG. 4A is a front view; FIG. 4B is a top view; and FIG. 4C is a top sectional view taken along line A-A shown in FIG. 4A.

FIGS. 5A and 5B are drawings showing a container storage of a third preferred embodiment of the present invention, in which FIG. 5A is a side view; and FIG. 5B is a top view.

FIGS. 6A and 6B are drawings showing an example of a container storage of a fourth preferred embodiment of the present invention, in which FIG. 6A is a side view; and FIG. 6B is a top view.

DETAILED DESCRIPTION OF THE PREFERRED EMBODIMENTS

Figure 1:
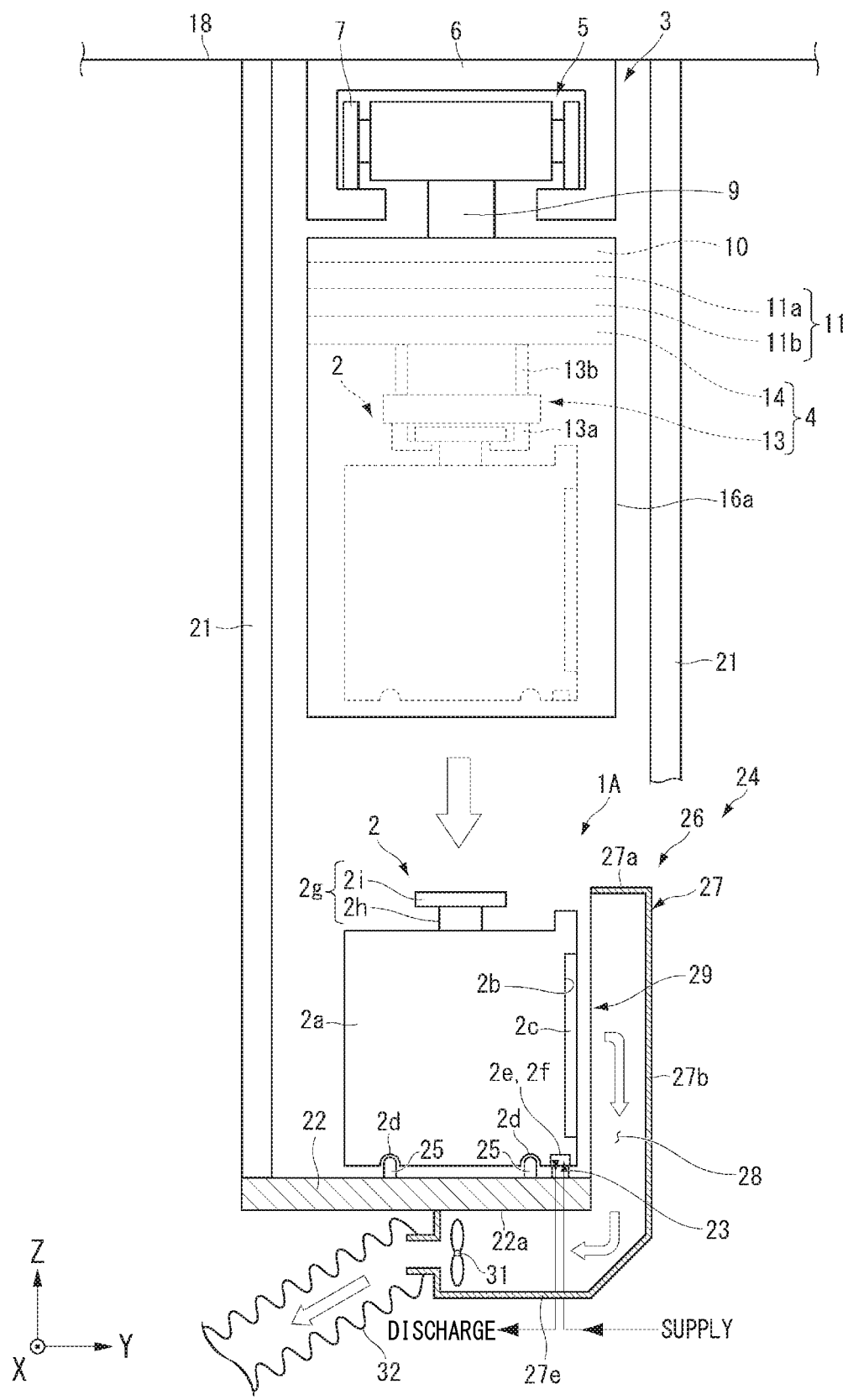
FIG. 1 is a side view showing an example of a container storage of a first preferred embodiment of the present invention.

Preferred embodiments of the present invention will be described with reference to the drawings. However, the present invention is not limited thereto. For the description of the preferred embodiments, the drawings are scaled, for example, partially enlarged or highlighted, as necessary. In the drawings, directions are shown by an XYZ coordinate system. In this XYZ coordinate system, a plane parallel with a horizontal plane is referred to as an XY-plane, and the direction perpendicular to the XY-plane as a Z-direction. In the drawings, the directions of arrows represent the positive X-, Y-, and Z-directions, and the directions opposite to the directions of the arrows represent the negative X-, Y-, and Z-directions.

First Preferred Embodiment

Figure 2A:
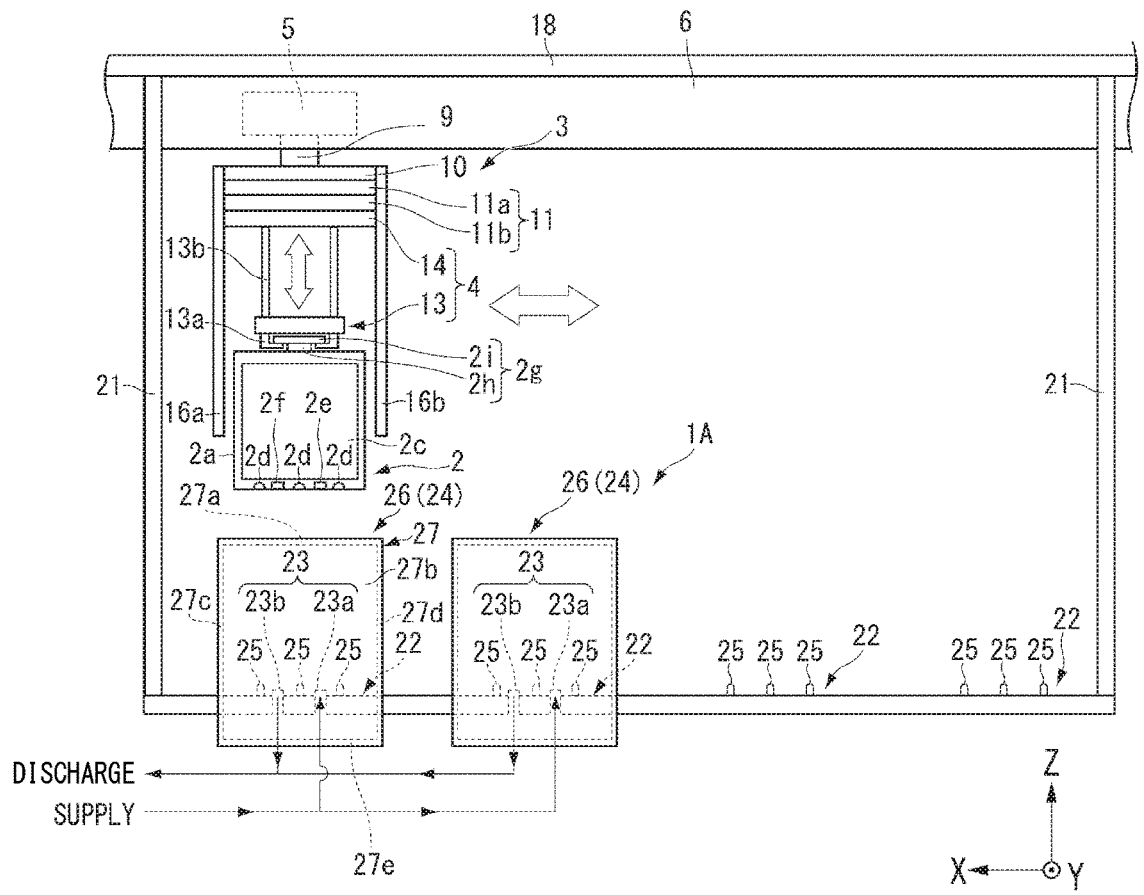
FIG. 2A is a front view of the container storage shown in FIG. 1.
Figure 2B:
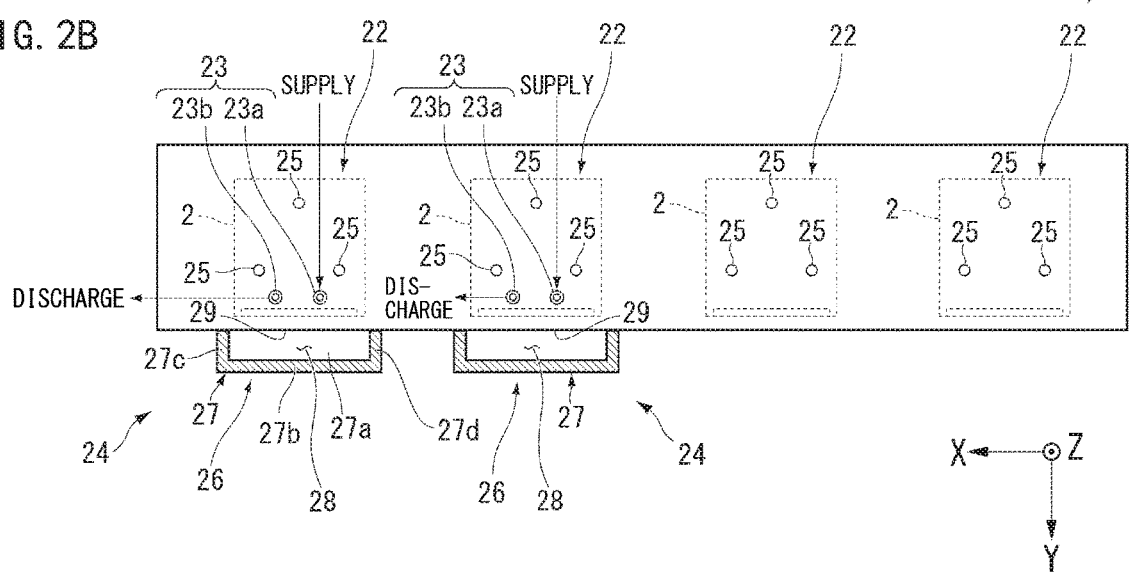
FIG. 2B is a top view of the container storage shown in FIG. 1.

FIGS. 1, 2A, and 2B are drawings showing an example of a container storage 1A of a first preferred embodiment of the present invention. FIG. 1 is a side view; FIG. 2A is a front view; and FIG. 2B is a top view. For example, the container storage 1A is installed in a semiconductor device manufacturing plant and stores containers 2.

Each container 2 contains articles, such as wafers or reticles, used to manufacture semiconductor devices. For example, the containers 2 are FOUPs, SMIF pods, or reticle pods whose inside are able to be purged. FIG. 1 shows an example in which the containers 2 are FOUPs. Each container 2 includes a body 2a, an opening 2b, and a lid 2c that blocks the opening 2b. The opening 2b is oriented in the horizontal direction (the positive Y direction in FIG. 1). Articles such as wafers are inserted into the container 2 through the opening 2b. The lid 2c is disposed so as to block the opening 2b and is detachable from the container 2. The body 2a includes positioning recesses 2d in the bottom thereof.

The body 2a also includes a gas supply port 2e and a gas discharge port 2f in the bottom. The gas supply port 2e and the gas discharge port 2f are disposed in the positive Y-direction end of the body 2a. The inside and outside of the body 2a communicate with each other through the supply port 2e and discharge port 2f. The supply port 2e and the discharge port 2f are provided with check valves (not shown). For example, the top of the container 2 is provided with a flange 2g. The flange 2g includes a base joint 2h and a rectangular plate-shaped locking receptacle 2i mounted on the joint 2h.

Containers 2 are transported to processors (not shown) by a transporter, such as a ceiling transport vehicle 3, and then transported from the processors. For example, the processors are a film formation unit, a coater/developer, an exposure apparatus, an etching apparatus, and the like and perform various types of processing in the device (e.g., semiconductor device) manufacturing process. For example, the container storage 1A is placed on the transportation route along which containers 2 are transported, and containers 2 are temporarily stored in the container storage 1A.

The ceiling transport vehicle 3 includes a raise/lower driver 4 that vertically raises and lowers a container 2 while holding the container 2 and a traveling driver 5. The ceiling transport vehicle 3 travels along a traveling rail (track) 6 by the driving force of the traveling driver 5. For example, the traveling rail 6 is disposed near the ceiling of a clean room and extends in the X-direction. The traveling driver 5 includes traveling wheels 7, a linear motor (not shown), an encoder (not shown), and the like. The traveling wheels 7 are disposed in contact with the traveling rail 6. The encoder detects the number of revolutions of the traveling wheels 7, or the like and outputs the detection result to a controller (not shown). The controller controls the linear motor on the basis of the detection result of the encoder and thus controls the speed or stop position of the ceiling transport vehicle 3.

A support shaft 9 extending downward from the traveling driver 5 is mounted on the ceiling transport vehicle 3. A Y-direction mover 10 is mounted on a lower portion of the support shaft 9. A lateral extender 11 is mounted on a lower portion of the Y-direction mover 10. The raise/lower driver 4 is mounted on a lower portion of the lateral extender 11. The ceiling transport vehicle 3 is able to horizontally move the raise/lower driver 4 using the lateral extender 11.

The Y-direction mover 10 includes a Y-direction guide (not shown), a Y-direction driver (not shown), and the like. The Y-direction mover 10 is able to move the lateral extender 11 in the positive or negative Y-direction along the guide by the driving force of the Y-direction driver, such as an electric motor. The lateral extender 11 includes an upper plate 11a and a lower plate 11b which are stacked. The lateral extender 11 is able to move in the Y-direction relative to the Y-direction mover 10, and the lower plate 11b is able to move in the Y-direction relative to the upper plate 11a. The raise/lower driver 4 is mounted on the lower plate 11b. Thus, the raise/lower driver 4 is able to move in the Y-direction. The transfer of the container 2 using the Y-direction mover 10 and the lateral extender 11 will be described with reference to FIG. 9 later. The ceiling transport vehicle 3 does not have to include the Y-direction mover 10 or the lateral extender 11.

The ceiling transport vehicle 3 also includes a rotor (not shown). The rotor includes a rotary shaft (not shown), a rotation driver (not shown), and the like. The rotary shaft is disposed in parallel with the Z-direction and connected to the raise/lower driver 4. The rotation driver is an electric motor or the like and rotates the rotary shaft around the Z-direction. The rotor is able to rotate the rotary shaft by the driving force of the rotation driver to rotate the raise/lower driver 4 around an axis parallel with the Z-direction. The controller controls the rotor to rotate the raise/lower driver 4 to the target position. The ceiling transport vehicle 3 does not have to include the rotor.

The raise/lower driver 4 includes a holder 13 that holds a container 2 and a driver 14 that vertically moves the holder 13. The holder 13 grasps the flange 2g of the container 2 and thus holds the container 2 such that the container 2 is suspended therefrom. For example, the holder 13 is a chuck including horizontally movable claws 13a. The container 2 is held by the holder 13 by locating the claws 13a under the locking receptacle 2i of the container 2 and raising the holder 13. The holder 13 is connected to a suspender 13b, such as a wire or belt. The driver 14 is, for example, a hoist. The holder 13 is lowered by unreeling the suspender 13b and is raised by reeling the suspender 13b. The raise/lower driver 4 lowers or raises the holder 13 at a predetermined speed under the control of a controller (not shown). The raise/lower driver 4 holds the holder 13 at the target height under the control of the controller.

The Y-direction mover 10, the lateral extender 11, and the raise/lower driver 4 move in the X-direction integrally with the traveling driver 5. A cover 16a and a cover 16b are disposed on the negative X-side and the positive X-side, respectively, of the Y-direction mover 10, the lateral extender 11, and the raise/lower driver 4 (see FIG. 2A). The cover 16a and the cover 16b are supported by the ceiling transport vehicle 3 with the support shaft 9 therebetween and move in the X-direction integrally with the ceiling transport vehicle 3.

For example, the container storage 1A is located near the ceiling 18 and is able to receive containers 2 from the ceiling transport vehicle 3 transporting the containers 2. For example, the container storage 1A is a buffer that temporarily stores containers 2 transported by the ceiling transport vehicle 3. In FIGS. 1 and 2A and 2B, the container storage 1A is an under track buffer (hereafter referred to as "UTB") located directly below the traveling rail 6. The container storage 1A is fixed to the ceiling 18 with supports 21 therebetween.

As shown in FIGS. 2A and 2B, the container storage 1A includes mounts 22, purgers 23, and evacuators 24 (see FIG. 1). Each mount 22 is structured or configured such that a container 2 is able to be transferred thereonto by the ceiling transport vehicle 3. The ceiling transport vehicle 3 is able to place a container 2 on a mount 22 by lowering the container 2 from directly above the mount 22. While the number of mounts 22 disposed in the container storage 1A is four in FIGS. 2A and 2B, the number of mount(s) 22 may be one or any number equal to or greater than 2, for example.

Each mount 22 is provided with multiple pins 25 that position a container 2. In FIG. 2B, containers 2 placed on the mounts 22 are shown by broken lines. For example, three pins 25 are disposed so as to correspond to the positions of recesses 2d provided in the bottom of a container 2 and thus are able to be fitted into the recesses 2d. When a container 2 is placed on a mount 22, corresponding pins 25 are fitted into the recesses 2d of the container 2 and thus the container 2 is positioned. The shapes and numbers of the recesses 2d and pins 25 do not have to be those shown in FIG. 2A and may be any shapes and numbers.

Each purger 23 supplies a purge gas into a stored container 2. For example, a purge gas is supplied into containers 2 placed on mounts 22 provided with the purgers 23, of the mounts 22. While FIGS. 2A and 2B show an example in which the purgers 23 are disposed on positive X-side two mounts 22 of the four mounts 22, the purgers 23 may be disposed on any number of mounts 22.

For example, each purger 23 includes a purge nozzle 23a, a discharge nozzle 23b, and a flow-rate controller (not shown) (see FIGS. 2A and 2B). The purge nozzle 23a and the discharge nozzle 23b are disposed at the positive Y-direction end of the upper surface of the mount 22. The purge nozzle 23a and the discharge nozzle 23b are disposed such that when a container 2 is placed on the mount 22, the purge nozzle 23a and the discharge nozzle 23b are connected to the supply port 2e and the discharge port 2f, respectively, of the container 2. The purge nozzle 23a is connected to a purge-gas supply source (not shown) through piping (not shown) and the flow-rate controller. The purge gas is a gas that is inert to articles contained in a container 2, such as a nitrogen gas. For example, the discharge nozzle 23b is connected to a purge-gas discharge channel (not shown) through piping. For example, the purger 23 purges the inside of a container 2 using the purge gas by supplying the purge gas fed from the purge-gas source into the container 2 through the flow-rate controller (not shown), such as a mass flow controller, that controls the flow rate of the purge gas, piping (not shown), and the supply port 2e of the container 2 (see FIG. 2A). The gas inside the container 2 is discharged from the container 2 through the discharge port 2f (see FIG. 2A).

The purge gas supplied into the container 2 may leak from the sealed portion or the like of the lid 2c of the container 2. The purge gas may have an adverse effect on human bodies depending on the type or concentration of the gas. For example, if a container 2 is stored in an open area, the purge gas leaking from the lid 2c of the container 2 may degrade the surrounding environment. Since the purge gas leaking from the lid 2c of the container 2 may have a high concentration in the atmosphere near the lid 2c, the operator working near the lid 2c of the container 2 must exercise take caution.

Each evacuator 24 (see FIG. 1) is disposed near a lid 2c of a container 2. The atmosphere (gas) around the lid 2c is evacuated, and thus residence of the purge gas near the lid 2c that has leaked from the lid 2c of the container 2 is reduced or prevented. For example, the evacuator 24 includes a hood 26 and a fan 31.

The hood 26 guides the flow of the evacuated gas and forms (defines) the flow channel of the gas. For example, the hood 26 is disposed so as to face the lid 2c. In this case, the hood 26 is able to efficiently evacuate the gas leaking from the lid 2c of the container 2. For example, the hood 26 is disposed in a position that is near the lid 2c and is spaced from the lid 2c in the Y-direction (a direction perpendicular to the traveling direction of the traveling driver 5). The hood 26 is disposed in an area where when the ceiling transport vehicle 3 transports a container 2 to the mount 22, the ceiling transport vehicle 3 does not interfere (collide) with the hood 26.

For example, the hood 26 includes a wall 27, a space 28, and an opening 29. For example, the wall 27 includes a top portion 27a, a front portion 27b, a side portion 27c, a side portion 27d, and a bottom portion 27e. The top portion 27a is disposed on a plane parallel with a horizontal plane (XY-plane) and in a higher position (positive Z-direction position) than the upper end (the positive Z-direction end) of the lid 2c. The X-direction length of the top portion 27a (see FIG. 2B) is longer than the X-direction length of the lid 2c. The top portion 27a is disposed such that the lid 2c is located between the positive and negative X-direction ends thereof.

The positive Y-direction end of the top portion 27a is joined to the front portion 27b. The front portion 27b extends downward (in the negative Z-direction) from the top portion 27a on a cross-section of a YZ-plane, is bent in the negative Y-direction under the mount 22, and is joined to the bottom portion 27e. The side portion 27c and the side portion 27d are joined to the positive X-direction end and negative X-direction end, respectively, of the top portion 27a (see FIG. 2B). The side portion 27c and the side portion 27d extend downward from the top portion 27a and are joined to the bottom portion 27e (see FIG. 2A). The bottom portion 27e is disposed on a plane parallel with a horizontal plane (XY-plane) under the mount 22.

The space 28 is surrounded by the wall 27 and a lower surface 22a of the mount 22. For example, the space 28 has an L-shape on a cross-section of a YZ-plane. The space 28 defines and functions as the flow channel (movement path) of the evacuated gas.

The opening 29 is one end (inflow port) of the gas flow channel in the hood 26. The opening 29 is open toward the lid 2c of the container 2 placed on the mount 22. The gas around the lid 2c is evacuated so as to be guided to the space 28 in the hood 26 through the opening 29. For example, the opening 29 has a rectangular shape. For example, the opening 29 is preferably larger than the lid 2c. The opening 29 is disposed such that the outer circumference of the lid 2c is located inside the inner circumference of the opening 29. The other end (discharge port) of the gas flow channel in the hood 26 is connected to a discharge channel 32.

The discharge channel 32 is, for example, piping and is a channel through which the gas evacuated through the opening 29 of the hood 26 is discharged. For example, the fan 31 is provided in the space 28 and guides the gas in the space 28 to the discharge channel 32. When the fan 31 operates (rotates), the gas channel in the hood 26 is decompressed, and the gas around the lid 2c is evacuated through the opening 29. For example, the discharge channel 32 is connected to the outside of the facility, or the like. The gas evacuated through the opening 29 of the hood 26 is discharged from the facility through the discharge channel 32.

For example, the fan 31 operates under the control of a controller (not shown). The controller controls the timing when the fan 31 evacuates the gas, by controlling the timing when power is supplied to the fan 31. For example, the fan 31 operates at the timing when the purge gas is supplied into the container 2. For example, the fan 31 operates in at least a portion of the period in which the purge gas is supplied into the container 2. The fan 31 may start to operate before supply of the purge gas into the container 2 starts, or may start to operate after supply of the purge gas into the container 2 starts. The fan 31 may also stop operating before supply of the purge gas into the container 2 stops, or may stop operating after supply of the purge gas into the container 2 stops.

The fan 31 does not have to operate at the above timing and may operate at any timing. For example, the fan 31 may operate continuously without interlocking with the operation of the purger 23. The fan 31 may also operate when the concentration of the purge gas detected using a purge gas detection sensor exceeds a predetermined threshold.

If the opening 29 is preferably larger than the lid 2c as described above, the purge gas leaking from the lid 2c is able to be efficiently evacuated. However, the opening 29 may have any size and shape. The size of the outline of the opening 29 may be the same as the lid 2c or may be smaller than the lid 2c. The opening 29 may be provided only in a portion near the periphery of the lid 2c.

If the evacuator 24 includes the fan 31 as described above, the gas around the lid 2c is able to be efficiently evacuated.

However, the fan 31 does not have to be disposed in the space 28. For example, the fan 31 may be disposed in the discharge channel 32, or may be disposed near the opening 29. Also, the evacuator 24 does not have to include the fan 31. For example, the evacuator 24 may include an evacuator that does not use a fan, in place of the fan 31. Also, a fan 31 or evacuator (e.g., discharge equipment in the plant) different from the evacuator 24 may be connected to a hood 26 through piping or the like. Also, the number of fans 31 may be two or more.

If the container storage 1A includes the discharge channel 32 as described above, the evacuated gas is fed to the discharge channel 32 and thus the gas is able to be reliably removed from the vicinity of the container 2. However, the container storage 1A does not have to include the discharge channel 32. For example, if the gas evacuated from the hood 26 is disposed of by being diffused, there is no need to include the discharge channel 32. Also, instead of including the discharge channel 32, the hood 26 may be connected to a predetermined discharge channel (discharge pipe).

Figure 3:
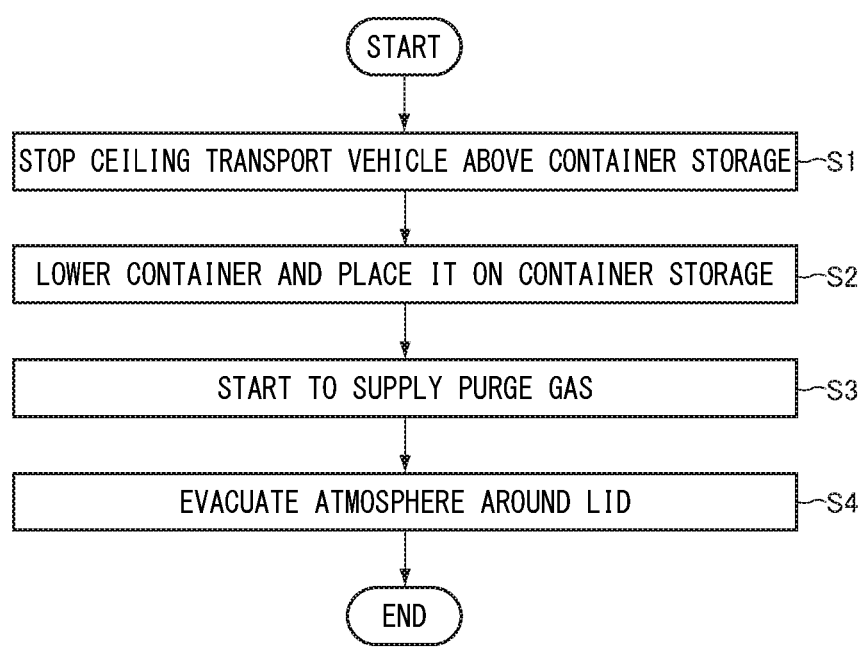
FIG. 3 is a flowchart showing an example of a container storage method of the first preferred embodiment of the present invention.

Next, a container storage method will be described on the basis of the operation of the container storage 1A. FIG. 3 is a flowchart showing an example of the container storage method. In the description of the container storage method, FIGS. 1, 2A, and 2B are referred to as necessary.

In step S1, the controller, which controls the ceiling transport vehicle 3, stops the ceiling transport vehicle 3 carrying (transporting) a container 2 above the container storage 1A. In step S2, the ceiling transport vehicle 3 lowers the carried container 2 using the raise/lower driver 4 and places the carried container 2 on a mount 22 provided with a purger 23. In step S3, the purger 23 starts to supply the purge gas into the container 2. For example, the purger 23 supplies the purge gas into the container 2 through the supply port 2e (see FIG. 2A) and thus purges the inside of the container 2 using the purge gas. Then, in step S4, the evacuator 24 evacuates the atmosphere around the lid 2c. For example, the evacuator 24 evacuates the atmosphere around the lid 2c by operating the fan 31, the evacuated atmosphere is discharged from the facility through the flow channel in the hood 26 and the discharge channel 32. For example, step S4 is performed while supplying the purge gas into the container 2. In this case, the evacuator 24 evacuates the atmosphere around the lid 2c at the timing when the purge gas is supplied. This reduces or prevents useless evacuation and thus a reduction in the operation cost.

As seen above, the container storage method involves evacuating the atmosphere around the lid 2c of the container 2 while supplying the purge gas to the stored container 2. Thus, even if the gas leaks from the lid 2c of the container 2, the gas is evacuated, allowing for suppression of environmental degradation around the lid 2c of the container 2. Step S4 may be started before step S1 is started. Step S4 may also be started between when step S1 is started and when step S2 is started. Step S4 may also be started between when step S2 is started and when step S3 is started. Step S4 may also be started after step S3 is ended. This container storage method does not have to include one or any of step S1 and step S2. For example, in this container storage method, step S3 and step S4 may be performed on a container 2 placed on the mount 22 in advance.

As seen above, the container storage 1A of the present preferred embodiment evacuates the gas leaking from the lid 2c of the container 2 using the evacuator 24 and thus is able to reduce or prevent environmental degradation around the lid 2c of the container 2. Also, the container storage 1A of the present preferred embodiment is located near the ceiling 18 and is able to receive a container 2 from the ceiling transport vehicle 3 carrying the container 2. Although the container storage 1A is an open structure, the gas leaking from the lid 2c of the container 2 is evacuated using the evacuator 24 and thus is able to reduce or prevent environmental degradation around the container storage 1A.

Second Preferred Embodiment

Figure 4A:
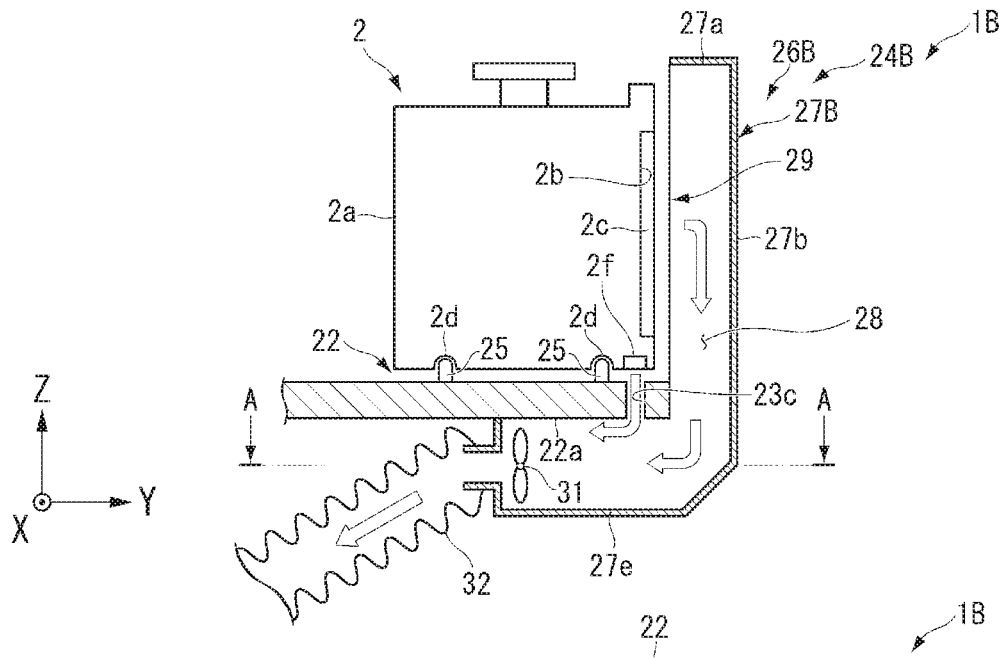
Figure 4B:
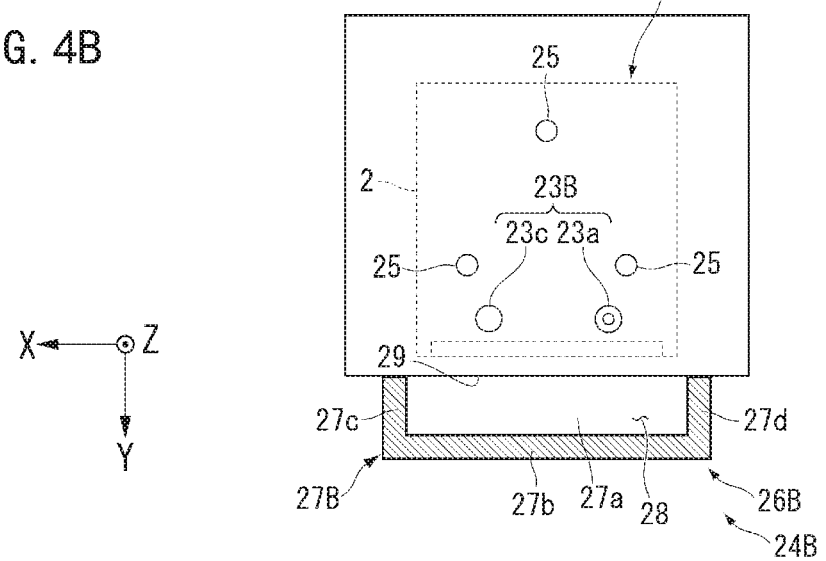
Figure 4C:
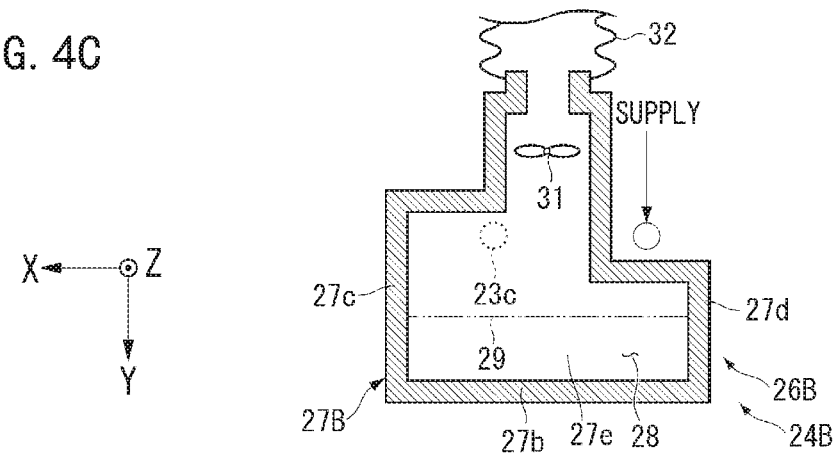

A second preferred embodiment of the present invention will be described. In the present preferred embodiment, elements similar to those of the above preferred embodiment are given the same reference signs, and description thereof is omitted or simplified. FIGS. 4A to 4C are drawings showing an example of a container storage 1B of a second preferred embodiment, in which FIG. 4A is a front view; FIG. 4B is a top view; and FIG. 4C is a top sectional view taken along line A-A shown in FIG. 4A.

The container storage 1B of the present preferred embodiment includes a mount 22, a purger 23B, an evacuator 24B, and a discharge channel 32 (see FIG. 4A). The mount 22 and the discharge channel 32 are similar to those of the first preferred embodiment. For example, the purger 23B includes a purge nozzle 23a and a discharge hole 23c (see FIG. 4B). The purge nozzle 23a is similar to that of the first preferred embodiment. The discharge hole 23c is a through hole provided under (e.g., directly under) a discharge port 2f of a container 2 placed on the mount 22 (see FIG. 4A). The discharge hole 23c connects the space under the discharge port 2f of the container 2 placed on the mount 22 and a space 28 in a hood 26B.

For example, the evacuator 24B includes the hood 26B and a fan 31 (see FIG. 4A). The fan 31 is similar to that of the first preferred embodiment. The hood 26B includes a wall 27B, the space 28, and an opening 29. The opening 29 is similar to that of the first preferred embodiment. The wall 27B is disposed so as to define and function as a partition between the space (space 28) under the discharge hole 23c and the outside of the hood 26B. The wall 27B is also disposed so as to surround the discharge hole 23c on a cross-section shown in FIG. 4C. For example, a front portion 27b, a side portion 27c, a side portion 27d, a bottom portion 27e, and the like of the wall 27B surround the discharge hole 23c under the mount 22. The shape of a portion higher than the mount 22, of the wall 27B is similar to that of the first preferred embodiment (see FIG. 4A). The space 28 is surrounded by the wall 27B and a lower surface 22a of the mount 22.

The evacuator 24B evacuates the gas around the lid 2c of the container 2 by operating the fan 31. The evacuator 24B also evacuates the gas discharged from the discharge port 2f when the purger 23B supplies the purge gas into the container 2. The evacuator 24B also evacuates the gas leaking from the discharge port 2f of the container 2. The evacuated gas is discharged from the facility through the flow channel in the hood 26 and the discharge channel 32.

As seen above, the container storage 1B of the present preferred embodiment evacuates the purge gas discharged from the discharge port 2f using the evacuator 24B and thus is able to reduce or prevent environmental degradation caused by the gas discharged from the discharge port 2f. Also, the omission of a discharge nozzle in the purger allows for simplification of the configuration of the purger, avoidance of occurrence of particles caused by the contact between the discharge nozzle and the container 2, and the like. The discharge hole 23c of the mount 22 may be located in any position around the discharge port 2f of the container 2 as long as the gas discharged from the discharge port 2f is evacuated through the discharge hole 23c and therefore does not have to be located directly under the discharge port 2f.

Third Preferred Embodiment

Figure 5A:
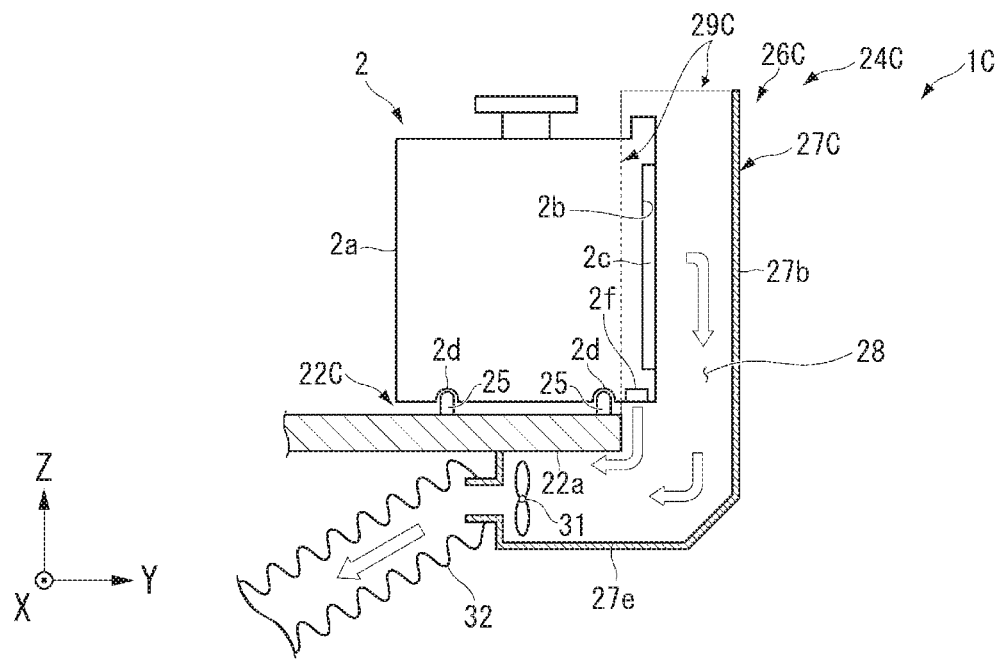
Figure 5B:
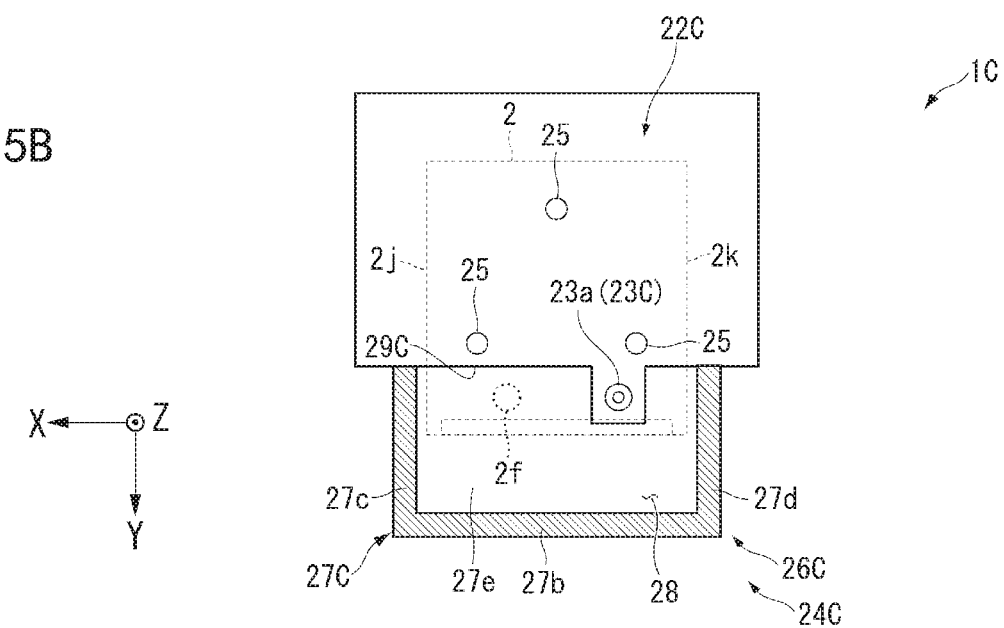

A third preferred embodiment of the present invention will be described. In the present preferred embodiment, elements similar to those of the above preferred embodiments are given the same reference signs, and description thereof is omitted or simplified. FIGS. 5A and 5B are drawings showing an example of a container storage 1C of a third preferred embodiment, in which FIG. 5A is a side view and FIG. 5B is a top view.

The container storage 1C of the present preferred embodiment includes a mount 22C, a purger 23C, an evacuator 24C, and a discharge channel 32 (see FIG. 5A). The discharge channel 32 is similar to that of the first preferred embodiment. The mount 22C is provided with multiple pins 25, and a container 2 is placed on the mount 22C so as to be positioned by the pins 25 (see FIG. 5A). The mount 22C is disposed such that when the container 2 is placed thereon, the discharge port 2f of the container 2 is open downward (toward the space 28). For example, a lower portion of the discharge port 2f of the container 2 is notched, and the mount 22 is disposed such that the positive Y-direction end thereof is located in the negative Y-direction relative to the positive Y-direction end of the container 2 under the discharge port 2f. The purger 23C includes a purge nozzle 23a similar to that of the first embodiment (see FIG. 5B) but does not include the discharge nozzle 23b shown in FIGS. 2A and 2B.

For example, the evacuator 24C includes a hood 26C and a fan 31 (see FIG. 5A). The hood 26C includes a wall 27C, a space 28, and an opening 29C. The wall 27C is disposed such that a top portion of the container 2 placed on the mount 22C is open and the wall 27C surrounds the vicinity of the lid 2c of the container 2 and the discharge port 2f of the container 2. For example, a front portion 27b, a side portion 27c, a side portion 27d, and a bottom portion 27e of the wall 27C surround the vicinity of the lid 2c of the container 2 and the discharge port 2f of the container 2. The side portion 27c and the side portion 27d are disposed so as to surround at least portions of side surfaces (2j, 2k) (see FIG. 5B) of the container 2 above the mount 22C.

The space 28 is surrounded by the wall 27C and the lower surface 22a of the mount 22C. The opening 29C is provided in a portion facing the lid 2c of the container 2 placed on the mount 22C, of the evacuator 24C and a portion over the container 2, of the evacuator 24C. That is, the space 28 has a U-shape in a top view and is open upward. The space 28 is also structured to be used as a path (transportation route) through which the ceiling transport vehicle 3 (see FIG. 1) raises and lowers the container 2.

By operating the fan 31, the evacuator 24C evacuates the gas near the lid 2c of the container 2, as well as evacuates the purge gas discharged through the discharge port 2f. The evacuated gas is discharged from the facility through the flow channel in the hood 26 and the discharge channel 32.

As seen above, the container storage 1C of the present preferred embodiment evacuates the purge gas discharged from the container 2 using the evacuator 24B. This allows for omission or simplification of dedicated equipment, such as piping, to dispose of the discharged purge gas and simplification of the structure of the purger. Also, the container storage 1C evacuates the gas leaking from the discharge port 2f using the evacuator 24 and thus is able to reduce or prevent environmental degradation around the discharge port 2f of the container 2. Also, the container storage 1C is disposed such that the hood 26C surrounds at least portions of the side surfaces (2j, 2k) of the container 2 and thus is able to easily evacuate the gas leaking from the container 2, including the gas near the lid 2c of the container 2. Also, a portion above the space 28, of the hood 26C is open. Thus, when the container 2 is raised and lowered between the ceiling transport vehicle 3 and the mount 22C, the hood 26 avoids interfering with the container 2.

Fourth Preferred Embodiment

Figure 6A:
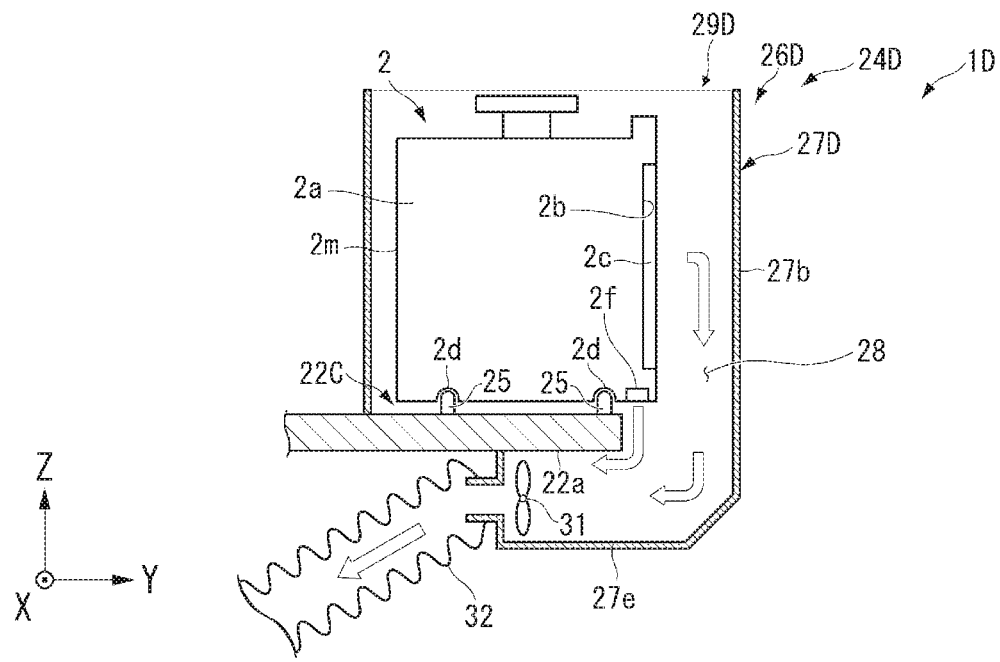
Figure 6B:
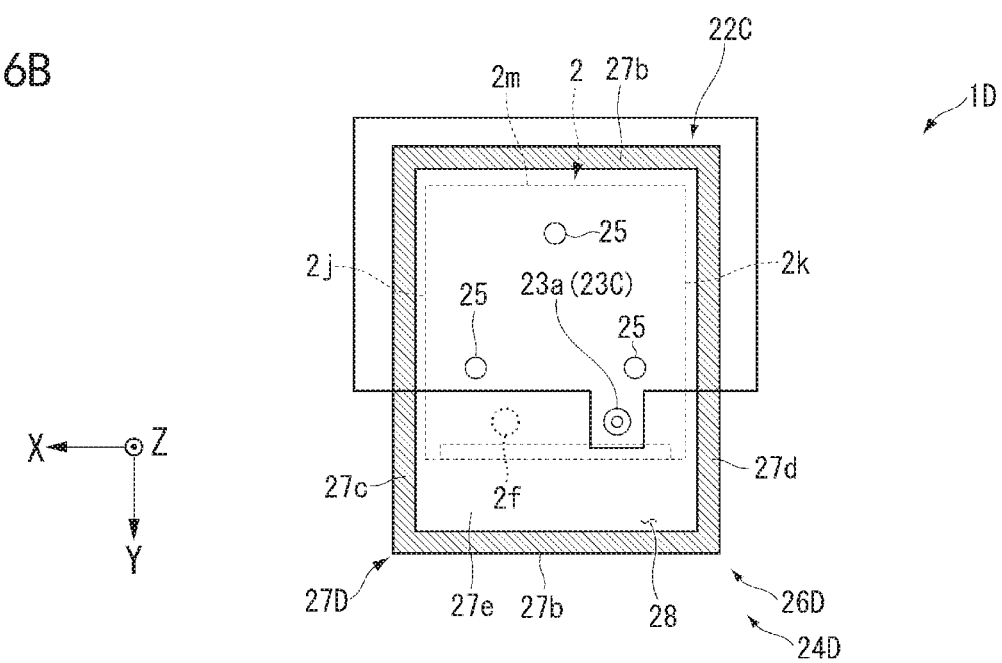

A fourth preferred embodiment of the present invention will be described. In the present preferred embodiment, elements similar to those of the above preferred embodiments are given the same reference signs, and description thereof is omitted or simplified. FIGS. 6A and 6B are drawings showing an example of a container storage 1D of a fourth preferred embodiment, in which FIG. 6A is a side view and FIG. 6B is a top view.

The container storage 1D of the present preferred embodiment includes a mount 22C, a purger 23C, an evacuator 24D, and a discharge channel 32. The mount 22C and the purger 23C are similar to those of the third preferred embodiment. The evacuator 24D includes, for example, a hood 26D, a fan 31, and the discharge channel 32. The hood 26D includes a wall 27D, a space 28, and an opening 29D.

The wall 27D is disposed such that a top portion of a container 2 placed on the mount 22C is open and the wall 27D surrounds the vicinity of a lid 2c of the container 2, side surfaces (2j, 2k) of the container 2, a rear surface 2m (negative Y-direction surface) of the container 2, and a discharge port 2f of the container 2 (see FIG. 6B). For example, a front portion 27b, a side portion 27c, a side portion 27d, a rear 27f disposed on the rear surface of the container 2, and a bottom portion 27e of the wall 27D surround the vicinity of the lid 2c of the container 2, a side surface 2j, a side surface 2k, a rear surface 2m, and the discharge port 2f of the container 2 over the mount 22C. The shape of a portion under the mount 22C, of the wall 27D is similar to that of the first preferred embodiment.

The space 28 is surrounded by the wall 27D and a lower surface 22a of the mount 22C. The opening 29D is provided in a portion above the container 2 placed on the mount 22C, of the wall 27D. The space 28 is open upward and can also be used as a path (transportation route) through which a ceiling transport vehicle 3 (see FIG. 1) raises and lowers the container 2.

By operating the fan 31, the evacuator 24D evacuates the gas near the lid 2c of the container 2, as well as evacuates the gas near the side surfaces (2j, 2k) and the rear surface 2m of the container 2. The evacuator 24D also evacuates the gas leaking from the discharge port 2f of the container 2. The evacuated gas is discharged from the facility through the flow channel in the hood 26 and the discharge channel 32.

As seen above, the container storage 1D of the present preferred embodiment evacuates the purge gas discharged from the container 2 using the evacuator 24D, allowing for simplification of the structure of the purger. The hood 26D is disposed so as to surround the side surfaces (2j, 2k) and the rear surface 2m of the container 2. Thus, the container storage 1E is able to easily evacuate the gas leaking from the container 2, including the gas near the lid 2c of the container 2, as well as is able to reduce or prevent flow of the gas leaking from the container 2 to a channel other than the flow channel (space 28) in the hood 26D.

Fifth Preferred Embodiment

Figure 7:
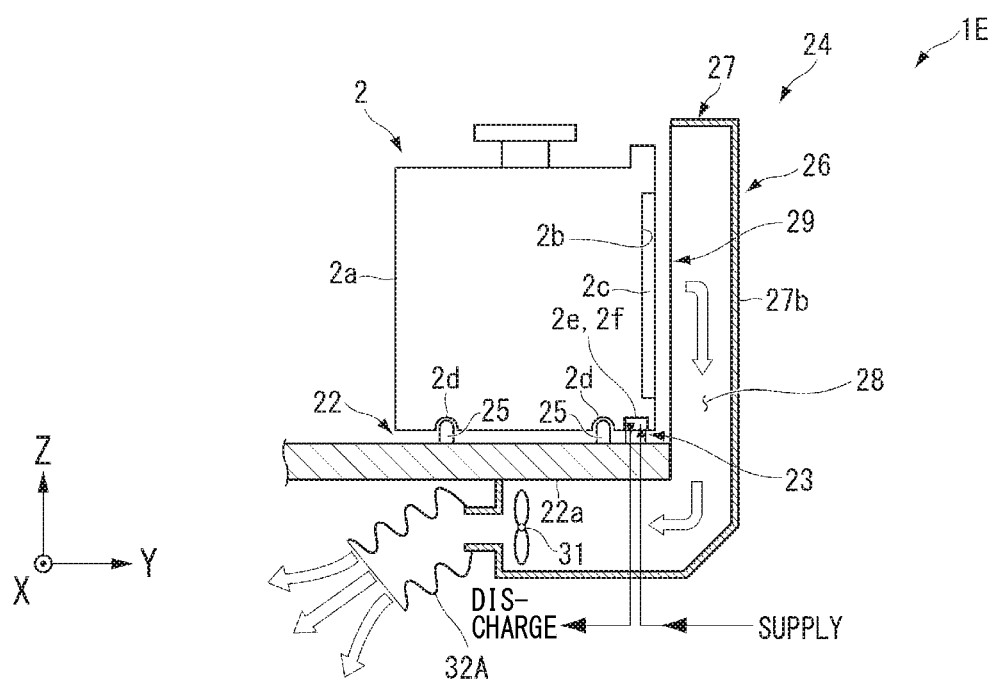
FIG. 7 is a side view showing an example of a container storage of a fifth preferred embodiment of the present invention.

A fifth preferred embodiment of the present invention will be described. In the present preferred embodiment, elements similar to those of the above preferred embodiments are given the same reference signs, and description thereof is omitted or simplified. FIG. 7 is a side view showing an example of a container storage 1E of the fifth preferred embodiment.

The container storage 1E of the present preferred embodiment includes a mount 22, a purger 23, an evacuator 24, and a discharge channel 32A. The mount 22, the purger 23, and the evacuator 24 are similar to those of the first preferred embodiment, but may be similar to those of any other preferred embodiment.

One end (inflow side) of the discharge channel 32A is connected to a hood 26, and the other end (outflow side) thereof is open toward below the mount 22. The gas evacuated by the evacuator 24 by operating a fan 31 is blown out below the mount 22 through the discharge channel 32A and thus diffused into the atmosphere. For example, assume that the purge gas is a nitrogen gas. By diffusing the nitrogen gas as described above, the concentration of the nitrogen gas occupied in the atmosphere is able to be reduced to a level such that the nitrogen gas does not have an adverse effect on human bodies.

As seen above, the container storage 1E of the present preferred embodiment disposes of the gas evacuated by the evacuator 24 by diffusing the gas. Thus, the container storage 1E is able to omit or simplify dedicated equipment, such as piping, to dispose of the discharged gas and to easily dispose of the gas leaking from the container 2.

Sixth Preferred Embodiment

Figure 8A:
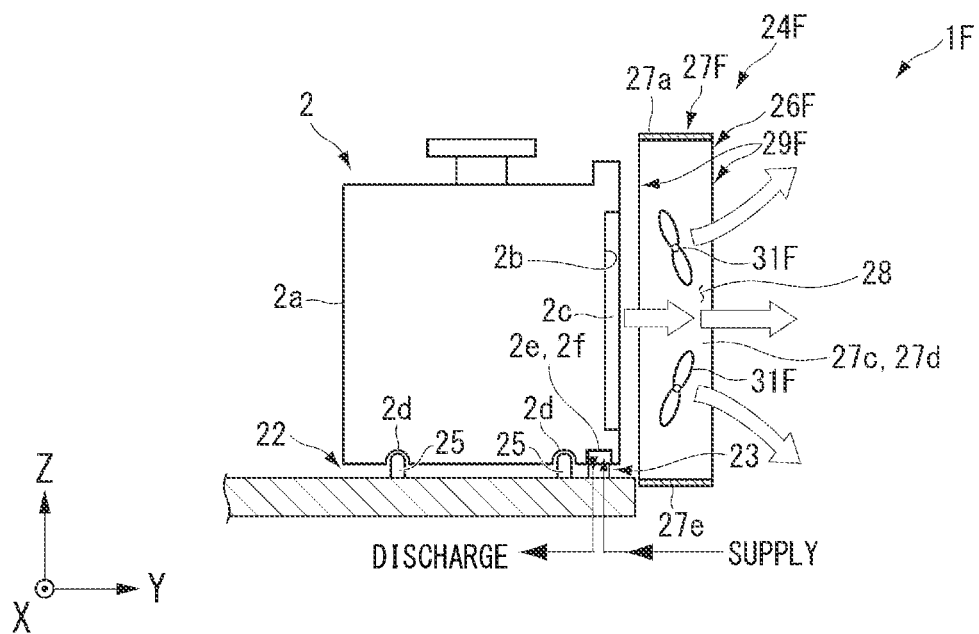
FIG. 8A is a side view showing an example of a container storage of a sixth preferred embodiment of the present invention.

A sixth preferred embodiment of the present invention will be described. In the present preferred embodiment, elements similar to those of the above preferred embodiments are given the same reference signs, and description thereof is omitted or simplified. FIG. 8A is a side view showing an example of a container storage 1F of the sixth preferred embodiment.

The container storage 1F of the present preferred embodiment includes a mount 22, a purger 23, and an evacuator 24F. For example, the evacuator 24F includes a hood 26F and multiple fans 31F. The hood 26F is disposed so as to face a lid 2c of a container 2. The hood 26F includes a wall 27F, a space 28, and openings 29F.

For example, the wall 27F has a shape surrounding the vicinity of the lid 2c of the container 2. For example, the wall 27F has a rectangular cylindrical shape that is open in the negative and positive Y-directions. For example, a top portion 27a, a side portion 27c, a side portion 27d, and a bottom portion 27e of the wall 27F surround the vicinity of the lid 2c. For example, the top portion 27a is disposed above (in the positive Z-direction) the upper end (the positive Z-direction end) of the lid 2c. For example, the bottom portion 27e is disposed below (in the negative Z-direction) the lower end (the negative Z-direction end) of the container 2. The side portion 27c is disposed in the positive X-direction relative to the positive X-direction end of the container 2. The side portion 27d is disposed in the negative X-direction relative to the negative X-direction end of the container 2.

The space 28 is surrounded by the wall 27F. The openings 29F are openings in the negative Y-direction and Y-direction of the wall 27F. For example, the positive and negative Y-direction openings 29F are preferably larger than the lid 2c. The positive and negative Y-direction openings 29F are disposed such that the outer circumference of the lid 2c is located inside the inner circumferences of the positive and negative Y-direction openings 29F.

The fans 31F are disposed in the space 28. The fans 31F guide the gas in the space 28 in a direction opposite to a direction toward the lid 2c (in the positive Y-direction). For example, the fans 31F are oriented in different directions. An upper fan 31F guides the gas in the space 28 in a direction between the direction opposite to the direction toward the lid 2c and the upward direction. A lower fan 31F guides the gas in the space 28 in a direction between the direction opposite to the direction toward the lid 2c and the downward direction. When the fans 31 operate (rotate), the gas channel in the hood 26 is decompressed, and the gas around the lid 2c is evacuated through the negative Y-direction opening 29F. The gas evacuated through the negative Y-direction opening 29F of the hood 26F is diffused into the air through the positive Y-direction opening 29F. If the container storage 1F includes fans 31F oriented in different directions, the gas is able to be efficiently diffused. The container storage 1F does not have to include multiple fans 31F and may include, for example, one fan 31F.

Figure 8B:
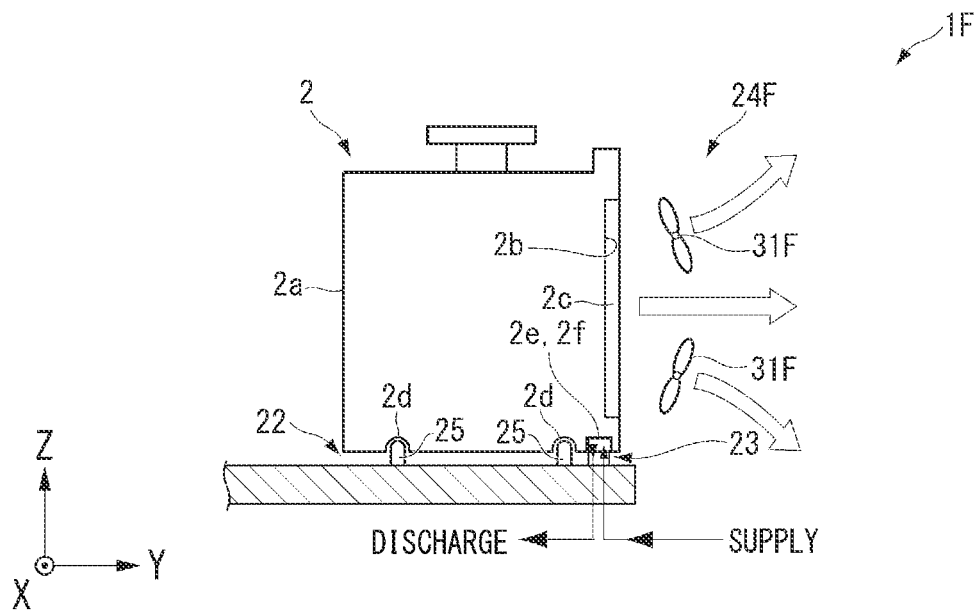
FIG. 8B is a side view showing another example.

FIG. 8B is a side view showing another example of the container storage 1F. As shown in FIG. 8B, this container storage 1F does not include a hood 26F. This container storage 1F has a configuration similar to the container storage 1F shown in FIG. 8A except for not including a hood 26F. When fans 31F of the container storage 1F shown in FIG. 8B operate (rotate), the atmosphere around a lid 2c of a container 2 is decompressed, and the gas around the lid 2c is evacuated in the positive Y-direction. The gas evacuated using the fans 31F is diffused into the air in the positive Y-direction. Since this container storage 1F does not include a hood 26F, the configuration of the storage is able to be simplified.

As seen above, the container storage 1F of the present preferred embodiment disposes of the gas evacuated by the evacuator 24F by diffusing the gas, that is, the gas leaking from the container 2 is able to be easily disposed of.

Seventh Preferred Embodiment

Figure 9:
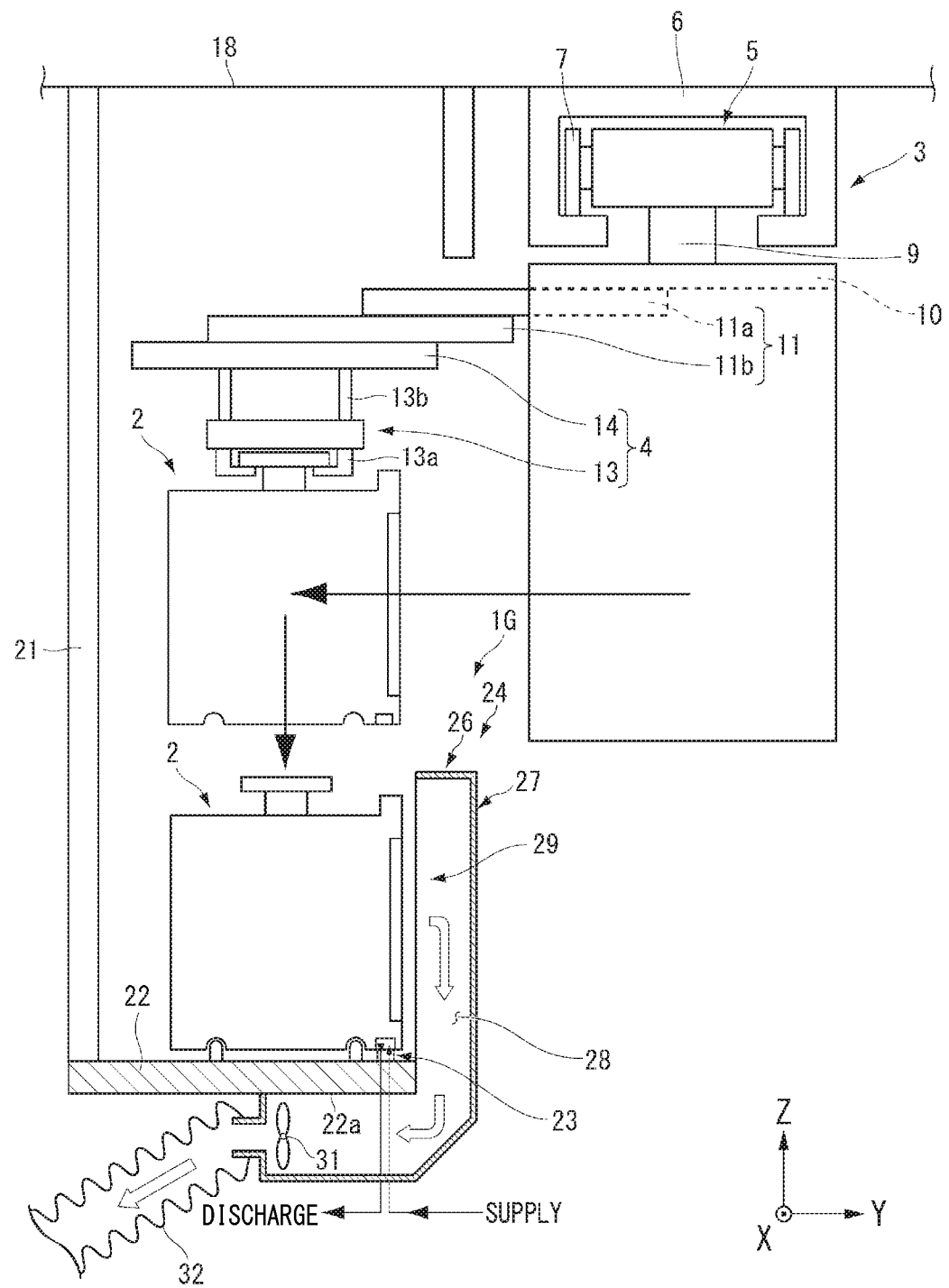
FIG. 9 is a side view showing an example of a container storage of a seventh preferred embodiment of the present invention.
Figure 10:
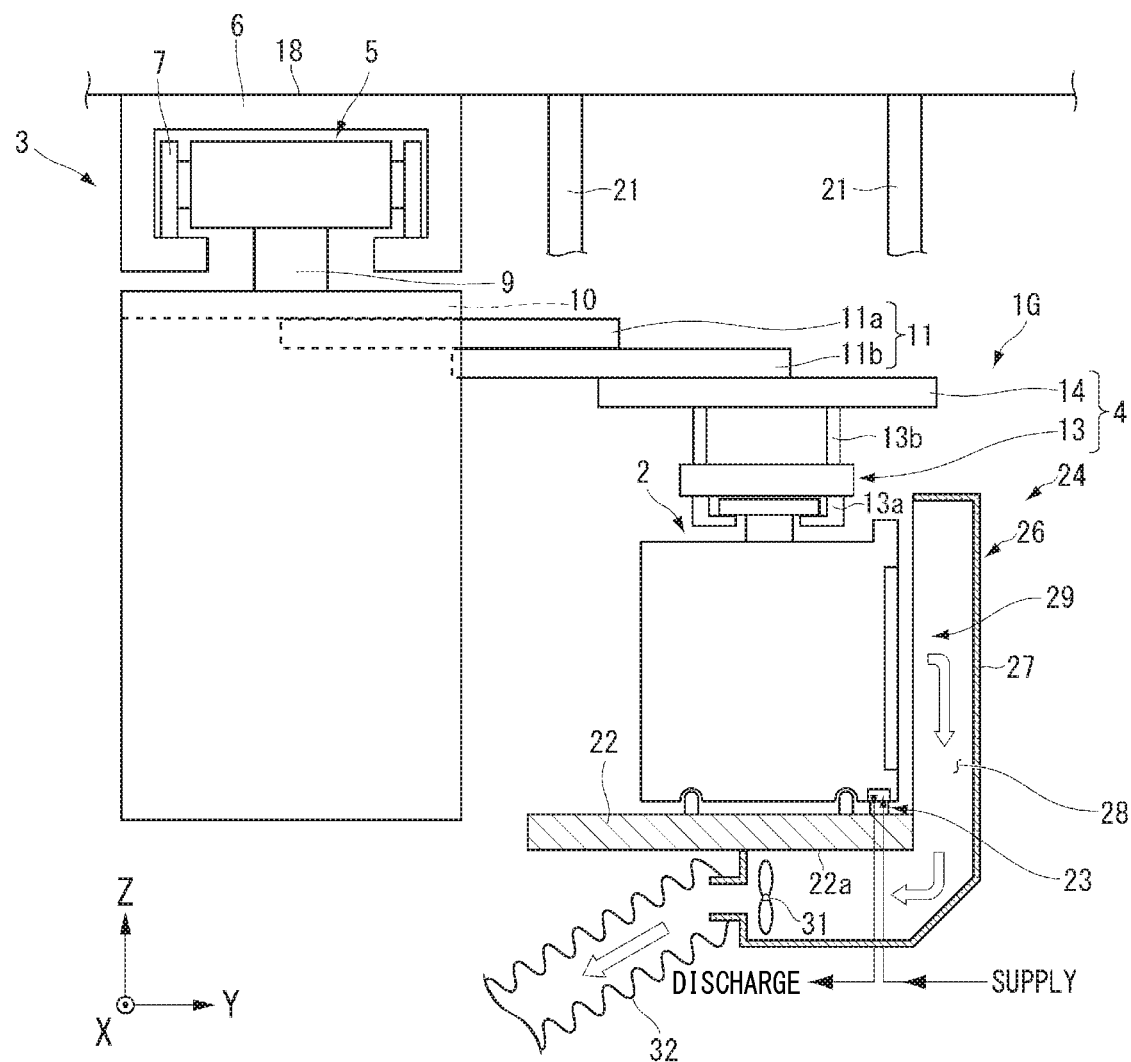
FIG. 10 is a side view showing another example of the container storage of the seventh preferred embodiment of the present invention.

A seventh preferred embodiment of the present invention will be described. In the present preferred embodiment, elements similar to those of the above preferred embodiments are given the same reference signs, and description thereof is omitted or simplified. FIG. 9 is a drawing showing an example of a container storage 1G of the seventh preferred embodiment. FIG. 10 is a side view showing another example of the container storage 1G of the seventh preferred embodiment.

The container storage 1G of the present preferred embodiment is a side track buffer (hereafter referred to as "STB"). The container storage 1G is disposed near the ceiling and below a traveling rail 6 of a ceiling transport vehicle 3 in a direction perpendicular to the traveling rail 6 (in the negative Y-direction). The container storage 1G includes a mount 22. The ceiling transport vehicle 3 is able to transfer a container 2 to the mount 22 by moving a raise/lower driver 4 laterally.

The lateral movement (hereafter referred to as "lateral operation" in the present specification) of the raise/lower driver 4 will be described. The raise/lower driver 4 is able to move in the lateral direction (Y-direction), in which covers 16a, 16b (see FIG. 2A) are not provided, in the space containing the container 2. As shown in FIG. 9, when moving the raise/lower driver 4 in the negative Y-direction, a Y-direction mover 10 drives an upper plate 11a of a lateral extender 11 in the negative Y-direction relative to the Y-direction mover 10 by a driving force of a Y-direction driver (not shown), such as an electric motor. The Y-direction mover 10 also moves a lower plate 11b to the target position by driving the lower plate 11b in the negative Y-direction relative to the upper plate 11a. The raise/lower driver 4 is disposed on the lower surface of the lower plate 11b. The raise/lower driver 4 lowers a holder 13 by unreeling a suspender 13b downward and thus places the container 2 on the target position.

The container storage 1G includes the mount 22, a purger 23, an evacuator 24, and a discharge channel 32. The mount 22, the purger 23, the evacuator 24, and the discharge channel 32 are similar to those of the first preferred embodiment, but may be similar to those of any other preferred embodiment.

The mount 22 and a hood 26 are disposed such that the ceiling transport vehicle 3 is able to perform a lateral operation. The hood 26 is disposed such that the container 2 does not contact the hood 26 when the ceiling transport vehicle 3 transports the container 2 in the Y-direction by a lateral operation. For example, the hood 26 is disposed such that the upper end (the positive Z-direction end) of the hood 26 becomes lower than the lower end (the negative Z-direction end) of the container 2 moved in the Y-direction by a lateral operation of the ceiling transport vehicle 3. The hood 26 may be movably disposed so that when the ceiling transport vehicle 3 performs a lateral operation, the hood 26 is retreated to a place departing from the route along which the container 2 is transported.

FIG. 9 shows an example in which the container storage 1G is disposed in the negative Y-direction of the ceiling transport vehicle 3 and the lid 2c of the container 2 placed on the mount 22 is oriented in the direction of the ceiling transport vehicle 3 (the positive Y-direction). However, for example, as shown in FIG. 10, a container storage 1G may be disposed in the positive Y-direction of a ceiling transport vehicle 3, and a lid 2c of a container 2 placed on a mount 22 may be disposed in the positive Y-direction. In this case, when the ceiling transport vehicle 3 moves the container 2 in the Y-direction by a lateral operation, a hood 26 does not contact the container 2 and therefore the distance over which the container 2 is transported can be reduced.

Eighth Preferred Embodiment

Figure 11:
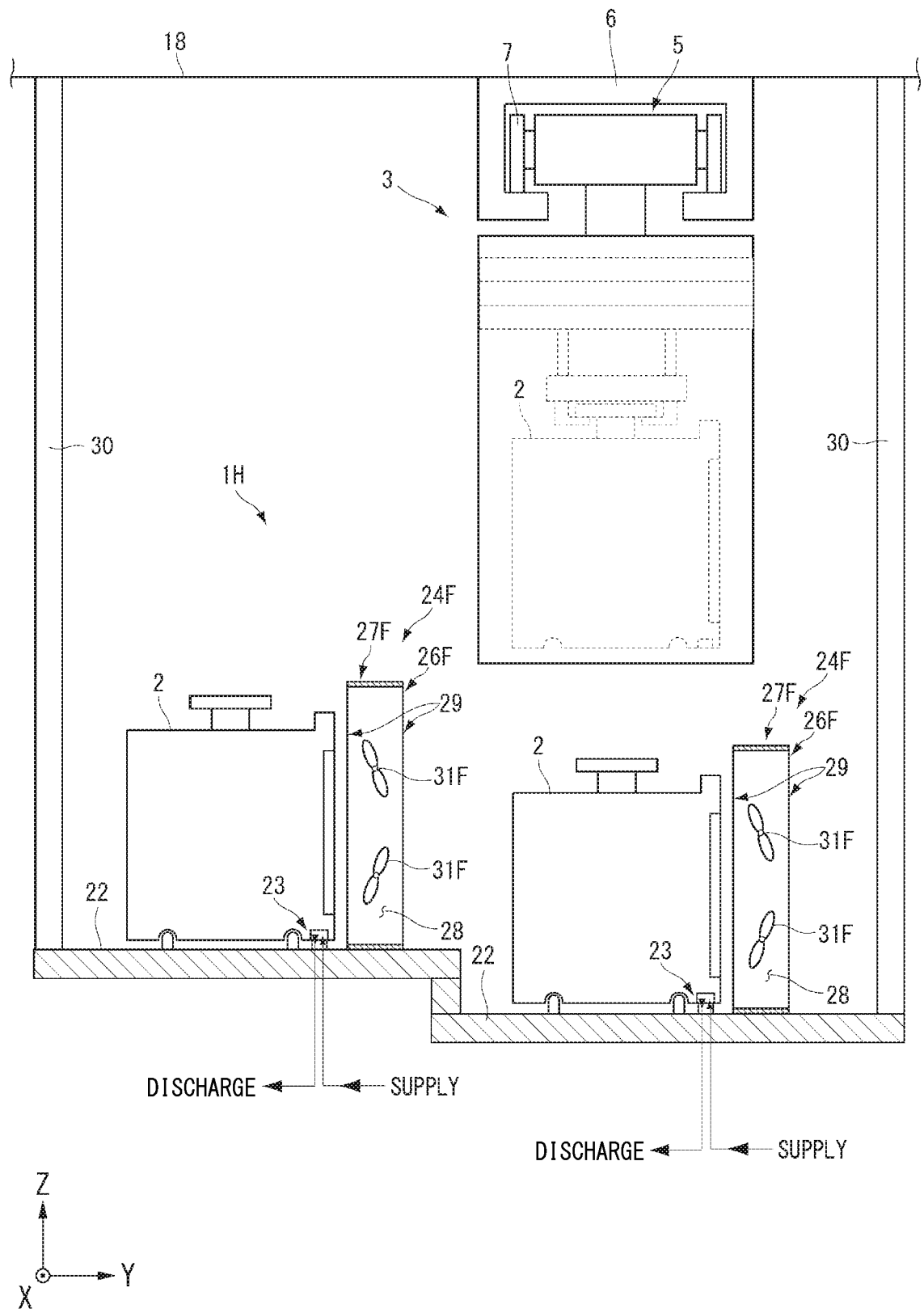
FIG. 11 is a side view showing an example of a container storage of an eighth preferred embodiment of the present invention.

An eighth preferred embodiment of the present invention will be described. In the present preferred embodiment, elements similar to those of the above preferred embodiments are given the same reference signs, and description thereof is omitted or simplified. FIG. 11 is a side view showing an example of a container storage 1H of the eighth preferred embodiment.

The container storage 1H of the present preferred embodiment is a buffer including a UTB and an STB. The container storage 1H is disposed near a ceiling 18. The container storage 1H is disposed on an integral frame 30. The UTB and the STB are similar to the UTB shown in FIG. 1 and the STB shown in FIG. 9 except that they are disposed on the frame 30.

For example, a mount 22 of the STB is disposed so as to be higher than a mount 22 of the UTB. Transportation of a container 2 to the STB is performed by a lateral operation of a ceiling transport vehicle 3 and therefore requires a longer time than transportation of the container 2 to the UTB. For this reason, the STB is disposed in a higher position. This allows for a reduction in the distance of transportation of the container 2 by a lateral operation of the ceiling transport vehicle 3 and thus allows for a reduction in the transportation time of the container 2.

The container storage 1H includes the mounts 22, purgers 23, and evacuators 24F. The mounts 22 and the purgers 23 are similar to those of the first preferred embodiment. The evacuators 24F is similar to that of the sixth preferred embodiment. The purgers 23 and the evacuators 24F may be those of any other preferred embodiment. The purgers 23 and the evacuators 24F are disposed on the mounts 22 of the UTB and the STB.

As seen above, the container storage 1H of the present preferred embodiment is able to be applied to buffers including a UTB and an STB. Also, the container storage 1H is structured or configured such that the UTB and the STB are disposed on the integral frame 30 and therefore the storage is able to be made compact.

Ninth Preferred Embodiment

Figure 12:
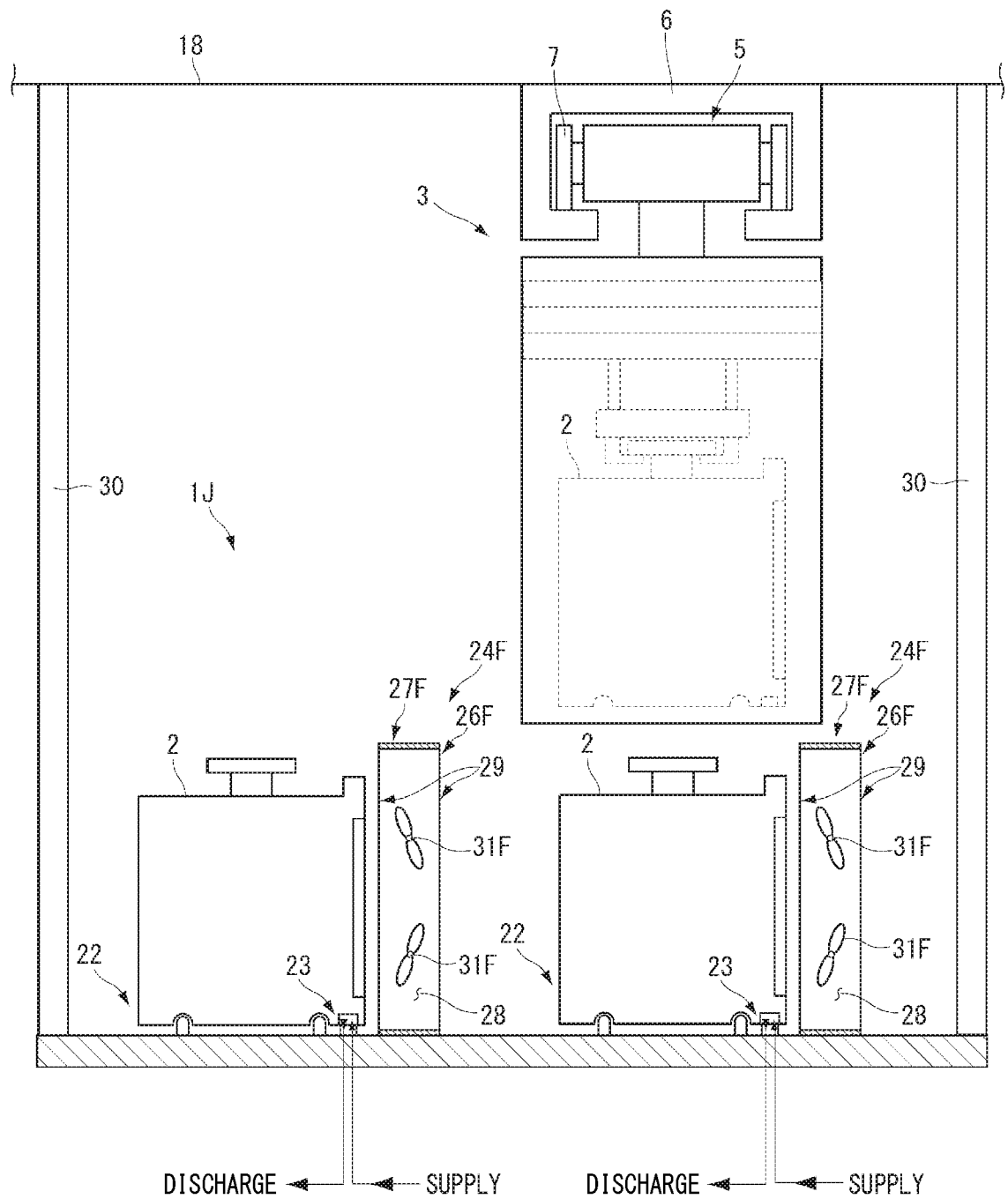
FIG. 12 is a side view showing an example of a container storage of a ninth preferred embodiment of the present invention.

A ninth preferred embodiment of the present invention will be described. In the present preferred embodiment, elements similar to those of the above preferred embodiments are given the same reference signs, and description thereof is omitted or simplified. FIG. 12 is a side view showing an example of a container storage 1J of the ninth preferred embodiment.

The container storage 1J of the present preferred embodiment is a buffer including a UTB and an STB. The container storage 1J is similar to that of the eighth preferred embodiment except that the STB is disposed at a height different from that of the eighth preferred embodiment. The container storage 1J of the present preferred embodiment is disposed such that a mount 22 of the STB and a mount 22 of the UTB are located at the same height.

The container storage 1J includes the mounts 22, purgers 23, and evacuators 24F. The mounts 22 and the purgers 23 are similar to those of the first preferred embodiment. The evacuators 24F is similar to that of the sixth preferred embodiment. The purgers 23 and the evacuators 24F may be those of any other preferred embodiment. The purgers 23 and the evacuators 24F are disposed on the mounts 22 of the UTB and the STB.

As seen above, the container storage 1J of the present preferred embodiment is able to be applied to buffers including a UTB and an STB. Since the container storage 1J of the present preferred embodiment is disposed such that the mount 22 of the STB and the mount 22 of the UTB are located at the same height, the structure of the storage is able to be simplified.

Tenth Preferred Embodiment

Figure 13:
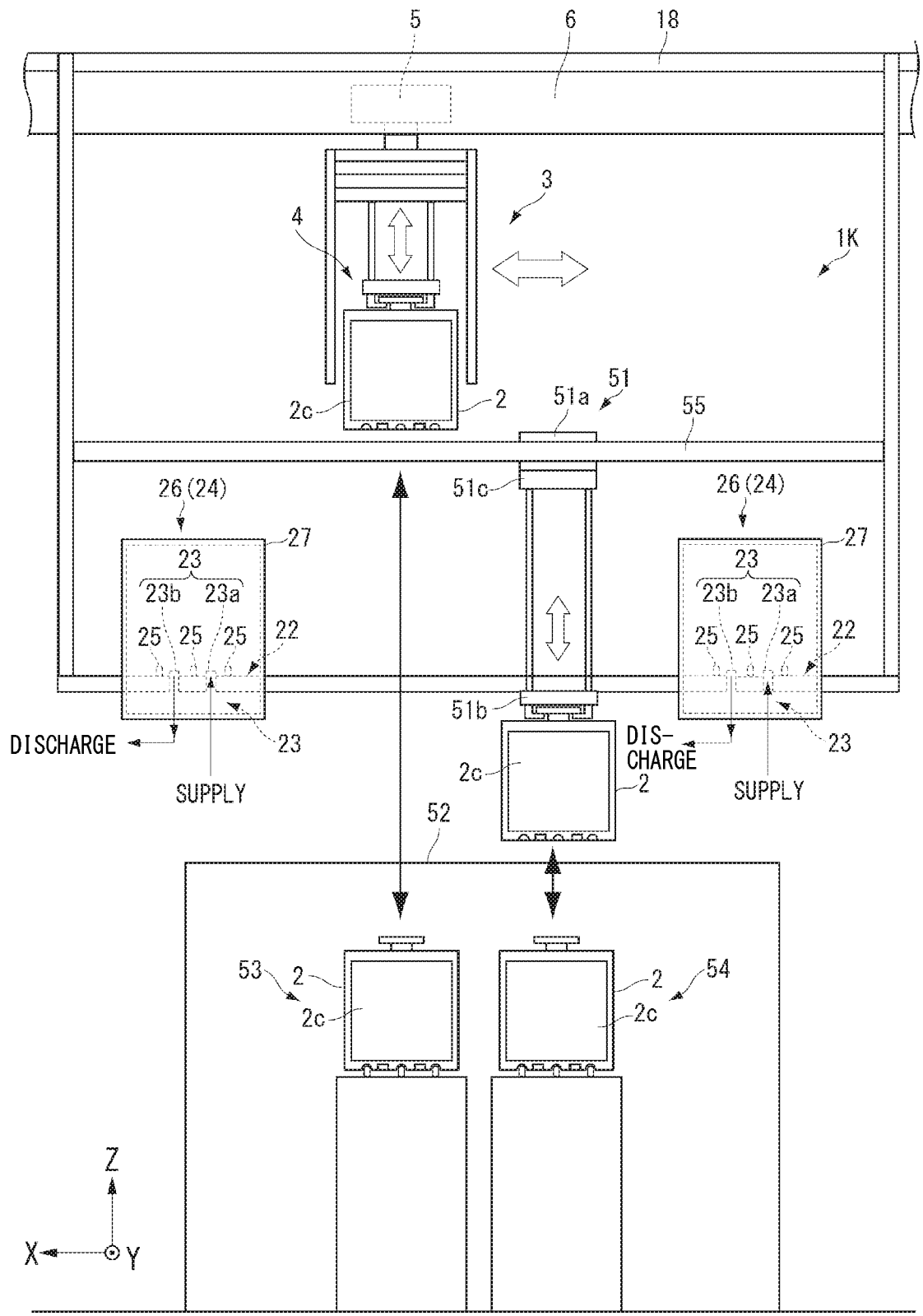
FIG. 13 is a front view showing an example of a container storage of a tenth preferred embodiment of the present invention.

A tenth preferred embodiment of the present invention will be described. In the present preferred embodiment, elements similar to those of the above preferred embodiments are given the same reference signs, and description thereof is omitted or simplified. FIG. 13 is a front view showing an example of a container storage 1K of the tenth preferred embodiment.

The container storage 1K of the present preferred embodiment is a buffer including multiple UTBs and a raise/lower unit 51. The container storage 1K is disposed near the ceiling. For example, the container storage 1K includes two UTBs. The two UTBs are disposed on the positive and negative X-direction ends of the container storage 1K.

Load ports (53, 54) of a processor 52 are arranged in a direction parallel with the X-direction directly below a traveling rail 6 of a ceiling transport vehicle 3. The ceiling transport vehicle 3 passes containers 2 to the load ports (53, 54) and receives containers 2 from the load ports (53, 54). The ceiling transport vehicle 3 transfers containers 2 under the control of a controller (not shown). As seen above, the ceiling transport vehicle 3 is able to pass and receive containers 2 to and from the UTBs, as well as is able to pass and receive containers 2 to and from the load ports (53, 54).

When driven by a driver 51a, the vertical mover 51 moves in the X-direction along a traveling rail 55 disposed in parallel with the traveling rail 6 of the ceiling transport vehicle 3. To avoid interference with the vertical transportation route of the ceiling transport vehicle 3, the traveling rail 55 is disposed in the positive and negative Y-directions relative to the vertical transportation route of the ceiling transport vehicle 3. The vertical mover 51 includes a holder 51b that holds a container 2. The holder 51b is mounted on a raise/lower driver 52c disposed below the driver 51a and is raised and lowered when driven by a raise/lower driver 51c. For example, the raise/lower driver 51c is a hoist.

The vertical mover 51 transfers containers 2 placed on the two UTBs to the load ports (53, 54). The vertical mover 51 also transfers containers 2 placed on the load ports (53, 54) to one of the two UTBs. The vertical mover 51 transfers containers 2 under the control of a controller (not shown).

If the load ports (53, 54) are empty, the ceiling transport vehicle 3 transfers containers 2 to be brought in the processor 52 (hereafter referred to as "bring-in containers 2") to the load ports (53, 54). If the load ports (53, 54) are not empty, the ceiling transport vehicle 3 transfers the bring-in containers 2 to the UTBs. If containers 2 to be taken out of the processor (hereafter referred to as "take-out containers 2") are placed on the load ports (53, 54), the vertical mover 51 transfers the take-out containers 2 from the load ports (53, 54) to the UTBs. If the load ports (53, 54) are empty and the bring-in containers are stored on the UTBs, the vertical mover 51 transfers the bring-in containers 2 to the load ports (53, 54). If the take-out containers 2 are placed on the load ports (53, 54) or the UTBs, the ceiling transport vehicle 3 receives the take-out containers 2 from the load ports (53, 54) or the UTBs. As seen above, the ceiling transport vehicle 3 and the vertical mover 51 transfer the containers 2 to the load ports (53, 54) and thus allow for efficient operation of the processor 52.

The container storage 1K includes mounts 22, purgers 23, evacuators 24, and discharge channels 32 (see FIG. 1). The mounts 22, the purgers 23, the evacuators 24, and the discharge channels 32 are similar to those of the first preferred embodiment, but may be similar to those of any other preferred embodiment. As seen above, the container storage 1K is able to be applied to buffer including UTBs and a vertical mover 51.

While the preferred embodiments have been described, the present invention is not limited thereto. Various changes can be made to the preferred embodiments without departing from the spirit and scope of the present invention.

While, in the above preferred embodiments, the evacuator 24 evacuates the atmosphere around the lid 2c, other configurations may be used. For example, an evacuator such as a fan may be disposed near the lid 2c, and the atmosphere around the lid 2c may be diffused by feeding the gas around the lid 2c toward the vicinity of the lid 2c using this evacuator. For example, this evacuator may be formed by orienting the fans 31F shown in FIGS. 8A and 8B toward the lid 2c.

While, in the above preferred embodiments, the container storages 1A to 1K are disposed near the ceiling, the container storages 1A to 1K do not have to be disposed near the ceiling. For example, the container storages 1A to 1K may be disposed on the floor, a shelf, or the load ports of the processor.

While, in the above preferred embodiments, the container storages 1A to 1K include the mount(s) 22, the purger(s) 23, the evacuator(s) 24, the discharge channel(s) 32, and the like, the container storages 1A to 1K may take a form in which a purger 23(s), an evacuator(s) 24, a discharge channel(s) 32, and the like are mounted on the mount(s) of an existing buffer.

The entire contents of Japanese Patent Application No. 2016-114321 and all documents cited in the present specification are hereby incorporated herein by reference as a part of the present description to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A container storage comprising:
   a mounting stage fixed to a support or a frame;
   a purger that is provided on the mounting stage to supply a purge gas into a container on the mounting stage from below the container, the container including a flange on a top of the container and a lid able to be positioned to block a side wall opening of a main body of the container; and
   an evacuator that is disposed spaced away from and adjacent to the lid to evacuate a gas leaking from between the side wall opening and the lid when the lid is supported by only the main body of the container and is positioned to block the side wall opening and the purger supplies the purge gas into the container; wherein
   when the container is on the mounting stage and the evacuator is disposed to evacuate the gas leaking from between the side wall opening and the lid, an area adjacent to an entire top surface of the flange is empty.

2. The container storage according to claim 1, wherein the container storage is disposed at or adjacent to a ceiling and is able to receive the container from a ceiling transport vehicle that transports the container.

3. The container storage according to claim 1, wherein the evacuator includes a hood facing the lid.

4. The container storage according to claim 3, wherein the hood surrounds a side surface of the container.

5. The container storage according to claim 3, further comprising a discharge channel through which a gas evacuated through the hood is discharged.

6. The container storage according to claim 1, wherein the evacuator includes a fan for diffusion.

7. A container storage method for storing a container on a mounting stage fixed to a support or a frame, the container storage method comprising:
   supplying a purge gas into the container on the mounting stage from below the container, the container including a flange on a top of the container and a lid able to be positioned to block a side wall opening of a main body of the container; and
   evacuating, by an evacuator disposed spaced away from and adjacent to the lid, a gas leaking from between the side wall opening and the lid when the lid is supported by only the main body of the container and is positioned to block the side wall opening and the purge gas is supplied into the container; wherein
   when the container is stored on the mounting stage and the evacuator is disposed to evacuate the gas leaking between the side wall opening and the lid, an area adjacent to an entire top surface of the flange is empty.

8. The container storage according to claim 3, wherein the hood extends at least from the top of the container to a bottom of the container in a vertical direction.

* * * * *